(12) United States Patent
Tarango et al.

(10) Patent No.: US 7,243,272 B2
(45) Date of Patent: Jul. 10, 2007

(54) TESTING OF INTEGRATED CIRCUIT RECEIVERS

(75) Inventors: Tony M. Tarango, Folsom, CA (US); Ronald W. Swartz, Granite Bay, CA (US)

(73) Assignee: Intel Corporation, Santa Clara, CA (US)

( * ) Notice: Subject to any disclaimer, the term of this patent is extended or adjusted under 35 U.S.C. 154(b) by 279 days.

(21) Appl. No.: 10/813,144

(22) Filed: Mar. 30, 2004

(65) Prior Publication Data

US 2005/0251710 A1 Nov. 10, 2005

(51) Int. Cl.
G11B 20/20 (2006.01)

(52) U.S. Cl. ...................................... 714/700

(58) Field of Classification Search ................ 714/700, 714/738; 324/763; 375/226, 376
See application file for complete search history.

(56) References Cited

U.S. PATENT DOCUMENTS

| | | | | |
|---|---|---|---|---|
| 5,737,369 A * | 4/1998 | Retzer | ........................ | 375/346 |
| 6,522,122 B2 * | 2/2003 | Watanabe et al. | ........ | 324/76.77 |
| 6,807,498 B2 * | 10/2004 | Premy | .......................... | 702/79 |
| 6,885,209 B2 * | 4/2005 | Mak et al. | ................... | 324/763 |
| 7,136,773 B2 * | 11/2006 | Ishida et al. | ................. | 702/120 |
| 2003/0002596 A1 | 1/2003 | Dunning et al. | | |
| 2003/0002607 A1 | 1/2003 | Mooney et al. | | |
| 2003/0122588 A1 | 7/2003 | Glenn | | |
| 2003/0123589 A1 | 7/2003 | Glenn et al. | | |
| 2003/0123594 A1 | 7/2003 | Glenn et al. | | |
| 2005/0172181 A1 * | 8/2005 | Huliehel | ...................... | 714/724 |

OTHER PUBLICATIONS

U.S. Appl. No. 10/383,501, filed Mar. 7, 2003, entitled "Techniques for Automatic Eye-Degradaton Testing of a High Speed Serial Receiver", Inventor(s)—Tony M. Tarango, et al.
U.S. Appl. No. 10/400,975, filed Mar. 26, 2003, entitled "A Method and an Apparatus for Transmit Phase Select", Inventor(s)—Tony M. Tarango, et al.

* cited by examiner

*Primary Examiner*—James C. Kerveros
(74) *Attorney, Agent, or Firm*—Blakely, Sokoloff, Taylor & Zafman LLP

(57) ABSTRACT

A method for testing a data recovery circuit (DRC) includes disturbing a running variable in a closed control loop of the DRC, as the DRC is processing a received test signal. Data recovered by the DRC, while the DRC was affected by the disturbance, is evaluated.

18 Claims, 4 Drawing Sheets

Couple a receiver that has a data recovery circuit (DRC) to a transmitter, to receive a test signal that includes a stream of transmitted bits. 104

Disturb a running phase of the DRC, as the DRC is processing the received test signal. 108

Evaluate the data recovered by the DRC, while the DRC was affected by the disturbance. 112

FIG. 1

TESTING OF INTEGRATED CIRCUIT RECEIVERS

BACKGROUND

An embodiment of the invention is generally related to the testing of high-speed data links, and in particular to determining robustness of link interface circuitry in the presence of jitter. Other embodiments are also described and claimed.

As the bit rate of a high-speed data link increases, its testing becomes more challenging. For example, recent advances in serial, point to point data links for integrated circuit input/output (or simply, chip I/O) are calling for bit streams at upwards of several GHz. At such high speeds, external test probes can disturb the transmission medium of the link and hence distort the test results. Accordingly, on-chip, built-in self-test techniques have been proposed, to test the link as a whole while it is operating "at speed", including the transmission medium and the chip I/O interface circuitry used in the link. In one such technique, a predefined test pattern transmitted by the chip is looped back to a receiver in the chip. The receiver recovers a sequence of bits that are compared with the test pattern, to determine any error.

With higher operating frequencies often comes a smaller margin for error. At higher operating speeds, a data link tolerates a smaller variation from its nominal design specification. Such variations may be caused by manufacturing/real world limitations in the transmission medium and link interface circuitry (e.g., driver and sampler termination mismatches relative to the line characteristic impedance; noise couplings; inter-symbol interference, etc.) Built-in self-test techniques have been developed that "stress" the link during operation, to determine its robustness or tolerance to such variations. This is also referred to as margining the link or determining the link's margin for error. In one such technique, a timing variation referred to as jitter is forced into the transmitter of the link. A transmitted signal carrying the clocked test bits is thus jittered, to exhibit certain forced time shifts. The effect of this jitter at the receiver is then evaluated, by determining whether the sequence of bits recovered by the receiver is the same as the transmitted one. The injected jitter is gradually worsened during the test until an error is detected, thereby giving a measure of the margin for error.

BRIEF DESCRIPTION OF THE DRAWINGS

The embodiments of the invention are illustrated by way of example and not by way of limitation in the figures of the accompanying drawings in which like references indicate similar elements. It should be noted that references to "an" embodiment of the invention in this disclosure are not necessarily to the same embodiment, and they mean at least one.

FIG. 1 depicts a flow diagram of a method for testing a data recovery circuit (DRC) in a data link receiver.

DETAILED DESCRIPTION

Figure 2:
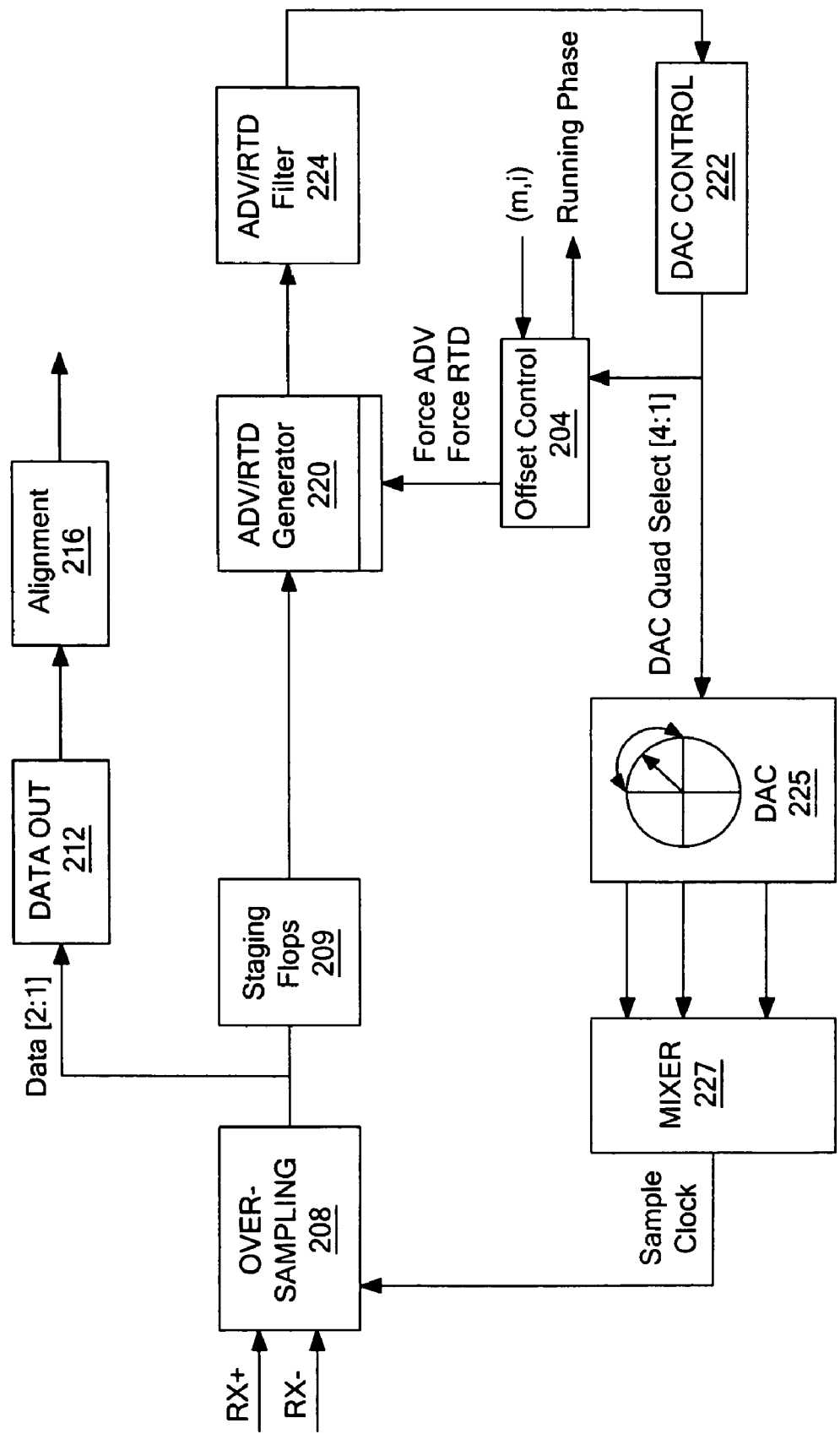
FIG. 2 shows a conceptual block diagram of a DRC with disturbance capability.

FIG. 1 depicts a flow diagram of a method for testing a data recovery circuit (DRC) in a data link receiver. In such a method, rather than rely solely on disturbing the transmitter, the receiver is disturbed during its normal operation. An effect of the disturbance (upon bits recovered by the receiver) is then evaluated.

The receiver is coupled to a transmitter to receive a signal that may include a stream of transmitted bits or data (operation 104). A "bit" as used here may be binary, or it may have more than two states (e.g., ternary). The bits may be clocked in that they are transmitted periodically, according to a transmitter reference clock. An associated clock may be embedded by the transmitter, e.g. encoded on the same transmission line in addition to the data. The embedded clock may ensure more frequent transitions in the received signal, so that the DRC may better estimate the arrival or sampling of the bits and thereby be more likely to remain error free.

The transmitter and receiver may be in the same packaged IC device, e.g. on-chip. In that case, the transmitted bits could be part of an internal test pattern that is looped back to the receiver. Alternatively, an external pattern may be used, where the transmitter and receiver operate in the same direction of a link and may be part of separately packaged, integrated circuit (IC) devices. The transmitter and receiver may be on opposite ends of a single lane in a multi-lane, serial point to point link between separately packaged IC devices.

The receiver may have knowledge of the exact frequency at which the bits were transmitted. This may be reflected in a local reference clock signal available to the DRC, whose frequency may be locked to that of the transmitter. However, the delay or phase of the bits relative to each other, as they arrive at the receiver, cannot be known exactly and may exhibit jitter due to practical limitations as mentioned above. Accordingly, the DRC is designed with a closed control loop that tries to select suitable timing/sampling points from the received signal, to recover the bits.

The received signal may be sampled several times per bit cell. A bit cell, also referred to as a unit time interval, is the interval of time defined for transmitting a single bit. A resulting "oversampled" input or window of samples (that may be more than one bit cell long) is then processed by the DRC in the discrete time domain, to determine which samples should be selected to be the recovered bits.

In addition, feedback from the sample processing is used to update or make adjustments to a "running phase" of the DRC. This update may for example advance or retard a phase of a sampling clock, which is used to actually sample the received signal. The running phase in this control loop may also be viewed as a variable that represents how to achieve at a given instant the best possible sampling point, e.g. at the center of a bit cell, for a recovered bit. Another way to interpret the running phase is to consider it to be the recovered clock phase, e.g. a receiver variable that estimates the phase behavior of a transmitter clock signal (that was used by the transmitter to drive the bits).

Returning to the flow diagram of FIG. 1, the method for testing the DRC in this embodiment is to disturb the running phase of the DRC, as the DRC is processing a received test signal (operation 108). For example, a change to a multi-value, binary running phase variable of the DRC may be forced. This change may be forced without altering the received test signal (e.g., the received test signal may be assumed to be "clean"), to isolate the behavior of the DRC during the test. The change may be implemented by forcing a sampling phase register of the DRC (that represents in discrete time the current phase of the recovered clock) to either advance by a single count (e.g., increment) or retard by a single count (e.g., decrement). A properly functioning DRC may then be expected to compensate for or at least react to such a change. The reaction of the DRC may be seen by for example monitoring the register to see whether it returns to its original value as the DRC continues to process the received signal.

There may be certain advantages to using the various embodiments of the invention described here. For instance, in one embodiment, the disturbance may be a purely "digital" manipulation. As such, the effect it produces may be highly predictable, thereby making it easier to quantify for example the "effective jitter" experienced by the receiver of a device. In contrast, with certain transmitter-based approaches it may not be immediately clear how much effective jitter would be observed by the receiver (until much characterization has been performed upon a relatively large number of manufactured devices). Simulations prior to manufacturing the device may be performed to determine this effective jitter, which may then be assumed to be the same across most if not all of the manufactured devices.

The digital manipulation embodiment also allows flexibility in how the running phase is manipulated and how its net effect is observed. For example, the disturbance may be jitter, defined in terms of two parameters, e.g. phase offset or magnitude and a time interval or frequency. These may be controlled with fine granularity in the case of an oversampling DRC that has high resolution (e.g., sixty-four (64) discrete values for the running phase). The loop response of the DRC may also be characterized, by observing the running phase as it is manipulated in the test. For example, the length of time it takes the DRC to recover from a disturbance can be measured using, for example, on-chip hardware counters.

Returning to FIG. 1, the method flow continues with operation 112 in which the data recovered by the DRC, while the DRC was affected by the disturbance, is then evaluated. Recall that the received signal may contain a stream of test bits clocked by the transmitter, to be recovered by the DRC. Thus, one way to evaluate the recovered data is to compare a test data sequence (that was transmitted) with a sequence of data recovered by the DRC. Alternatively, the evaluation may involve a self-comparison of the recovered data, to detect a predetermined pattern. The comparisons may be performed by a previously programmed, built-in self-test unit, which may be on-chip with the DRC. Alternatively, the comparisons may be performed externally after reading the recovered data, e.g. by an off-chip, platform management unit on the same computer system board, or by an external tester.

The above-described test methodology may be performed as part of a loop back test of a chip I/O link interface in an IC design validation or characterization process, to ensure correct tolerance by the receiver DRC. The methodology may also be performed as part of a high volume manufacturing (HVM) process that screens out parts that fail a predetermined disturbance setting. The HVM process may be one that tests just the IC device (with the DRC receiver therein), or it may be one that tests an entire system board or sub-system that contains the IC device.

Turning now to FIG. 2, a conceptual block diagram of a DRC with disturbance capability is shown. In this example, the received signal is a differential signal represented by RX+ and RX−. Accordingly, in this embodiment, the test methodology is referred to as being performed in a "Receiver Eye Stress Test Mode" or "REST Mode" for the device. That is because disturbing the running phase of the DRC in this case in effect stresses the "eye opening" of which the differential receiver is capable. The circuitry that implements this REST Mode may be integrated with an existing, high speed serial data link receiver whose DRC employs a phase interpolator (to be described further below).

Still referring to FIG. 2, the control loop of the DRC operates in the discrete time domain, in accordance with a loop processing clock (not shown). The control loop uses a local reference clock (whose fundamental frequency may be the same as that of the transmitter clock) to derive a sample clock having the correct phase for actually sampling the received signal. This control loop (also referred to as a phase interpolator loop) includes an oversampling unit 208 with an input for the received signal RX+, RX−, and an output for sampled data values, data [2:1]. The oversampling unit 208 actually samples the received signal in accordance with the sample clock that has been formed by a mixer unit 227 from the local reference clock. The DRC recovered data is provided by a data out unit 212 that may have one or more flop stages. The recovered data may then be fed to an alignment unit 216 that will indicate the correct boundaries between adjacent groups of bits (also referred to as symbols). The aligned symbols may then be passed on to higher level processing logic and software in the IC device.

The output of the oversampling unit 208 feeds sampled data values (through staging flops 209) to an advance/retard (ADV/RTD) generator 220. The latter serves to determine whether the data stream in the received signal (based upon the sampled data values) leads or lags a recovered clock phase. This recovered clock phase is represented in this example by a 4-bit binary value called DAC Quad Select [4:1]. This value is maintained by a digital to analog converter (DAC) control unit 222 that has a sampling phase register (not shown) which keeps track of the running phase of the DRC. Control signals, or also referred to as advance and retard signals, are provided to the DAC control unit 222 after being filtered by an ADV/RTD filter 224. The filter 224 may be a low pass, digital filter that serves to "smooth out" the control signals provided by the ADV/RTD generator 220 so as to make any changes to the running phase less drastic for rendering the control loop more stable.

The control loop may be clocked so that the running phase (e.g., at the output of DAC control unit 222) is updated in each cycle of the loop processing clock. The output of the DAC control unit 222 provides a variable that represents a number of discrete phase steps in terms of quadrants of a circle that spans one or more unit intervals (UIs). This variable is processed by what in effect may be referred to as a DAC unit 225. The range of conversion of this DAC unit 225, in this example, is two UIs (where each UI is represented by exactly one-half of a full circle). The output of the DAC unit 225 provides control signals to the mixer unit 227 which then interpolates a current phase of the sample clock by applying a number of discrete control signals to a fundamental phase clock or also referred to as the local reference clock (not shown). For example, the mixer unit 227 may subject the local reference clock to a delay that has been obtained through interpolation of the DAC Quad Select variable. This selection is effectively compared for each update, by the ADV/RTD generator 220 to see whether the new sample clock provides a better approximation to the ideal recovered phase (e.g., one that would sample each UI at its center).

The DRC is enhanced with the addition of an offset control unit 204 that allows a predetermined manipulation of the running phase of the phase interpolator loop. The offset control unit 204 receives parameters that define the disturbance as, for example, a binary-valued phase-step magnitude (or offset) m, and a binary-valued frequency or interval setting, i. The offset control unit causes changes to the running phase of the DRC, in accordance with the programmed magnitude and at the programmed intervals of time (or frequency). This is also referred to here as "kicking" the DRC running phase or injecting jitter into it. The parameters may have been programmed into a register section of the IC device (not shown). This register section may also allow reading the status of the DRC under test. For example, the offset control unit 204 may be designed to write to the register section the current value of the running phase.

The interval or frequency parameter, i, may be given in, for example, a number of periods of the loop processing clock. The m parameter causes the offset control block to signal the ADV/RTD generator 220 to force the advance of the running phase of the DRC by m phase steps. Note that upon sensing this phase shift, the phase interpolator loop should attempt to recover from the phase shift within the pre-selected time interval i. At the beginning of the subsequent i time interval, the ADV/RTD generator 220 may be forced to retard the phase of the DRC by m phase steps. Again, the phase interpolator loop should react to pull the running phase back to its nominal value. This process may be repeated several times, or for as long as the REST Mode is enabled, so as to emulate jitter in the received signal RX+, RX−. Here, instead of solely jittering a bit pattern at the transmitter, it is the receiver that is being manipulated into believing that there is jitter in the transmitter pattern when there actually is not. The phase interpolator loop will in effect behave as if the transmit pattern is being jittered.

The time interval i should be selected so as to be long enough to allow the DRC to compensate for an initial forced advance or retard of a counter. Thus, jitter may be simulated by forcing the sampling phase register to advance (by one or more predetermined phase steps) and then waiting for the DRC to compensate for the advance, and then forcing the counter to retard by one or more predetermined phase steps. This simulates the effect of jitter, which is typically the presence of relatively rapid and relatively small time shifts in the input signal that is being processed by the receiver. Other ways of defining the disturbance, for digital manipulation of a closed control loop of a DRC, are possible.

Figure 3A:
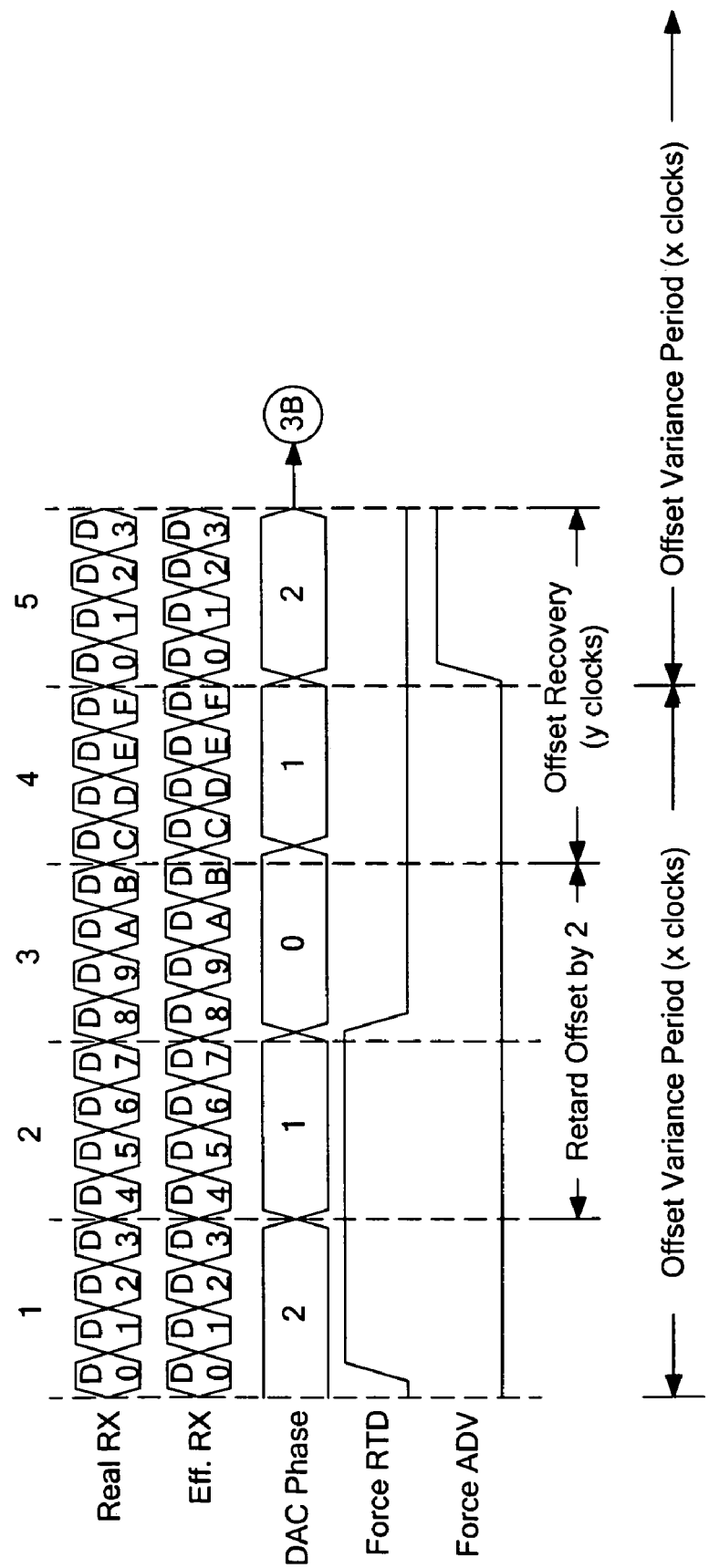
FIGS. 3A–3B illustrate an example timing diagram of the different variables involved during a jitter injection session.
Figure 3B:
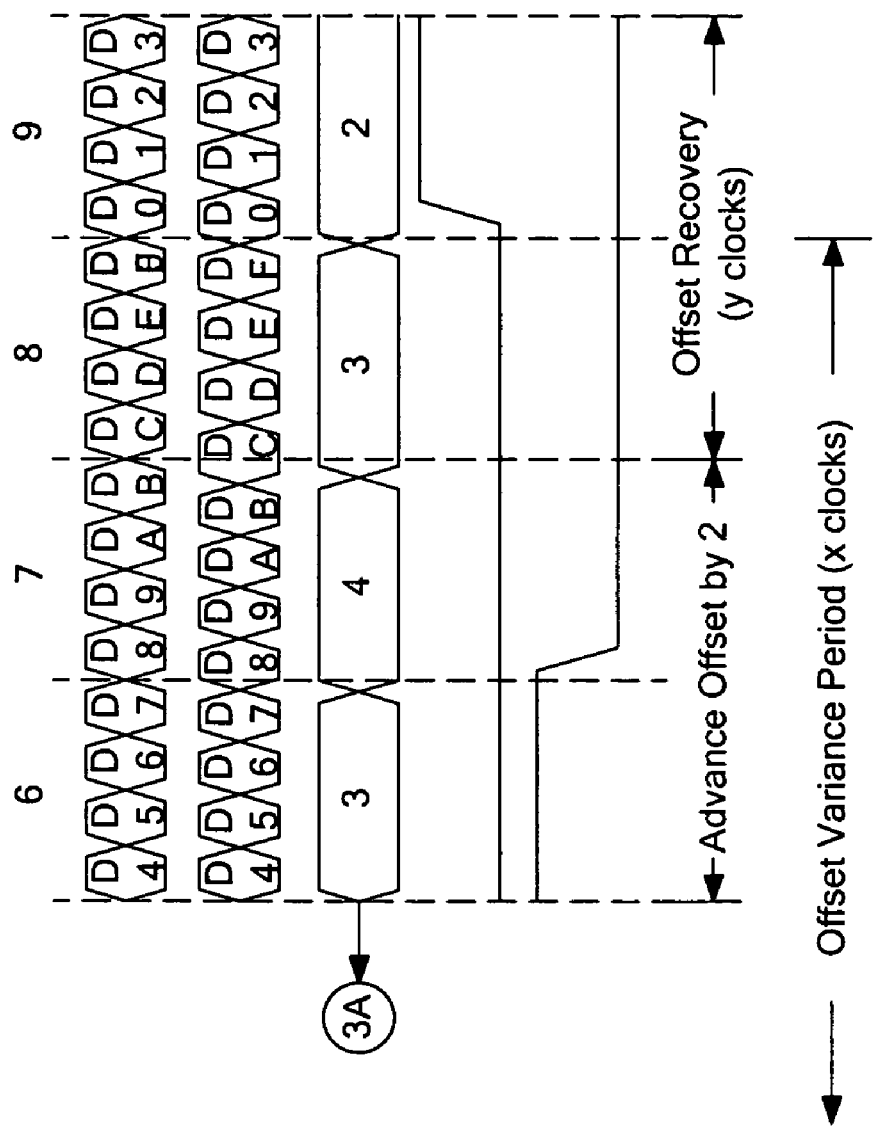

As an example of how the closed control loop described above works, and how the injected jitter may affect the recovered bit pattern, FIGS. 3A–3B illustrate an example timing diagram of the different variables involved during a jitter injection session. The figure also illustrates how the recovered bit pattern is affected by a disturbance, in this case jitter. There are four waveforms illustrated. The waveform labeled Real RX shows the transmitted data pattern that is being received. In this example, each cycle of the loop processing clock is to receive four bits. The next waveform labeled Eff. RX is the effective data pattern that the receiver will "see", when taking into account the effect from the REST Mode. Note how each group of 4-bits in the Real RX waveform is essentially aligned at the boundaries of the loop processing clock, whereas phase shifts appear in the Eff. RX waveform, starting with the second clock cycle. These phase shifts are caused by forcing a change to the natural or nominal behavior of the running phase variable, in this case referred to as DAC Phase.

In the example of FIGS. 3A–3B, 2 is the natural or nominal phase setting that the interpolator loop has selected, for this particular transmitted data pattern. In this example, a retard offset of 2 is forced, spread over two cycles, as shown. Note how this offset has caused a relatively significant phase shift between the Eff. RX and the Real RX waveforms. Although the diagram does not illustrate, such a phase shift may be sufficient to cause an error in the 4-bit recovered data DB. Note how, starting with the fourth loop processing cycle, the DAC Phase starts to recover and, in fact, by the fifth cycle has recovered its nominal value of 2. An offset recovery period y may be measured in this case to be two loop processing clock cycles.

The REST Mode in this case has been programmed with an interval i (also referred to here as offset variance period) of x=4 clocks. Accordingly, at the start of the fifth cycle, the running phase is forced to change in the other direction, namely an advance of, in this example, two phase steps. The forced change in this example is also gradually increased one phase step per cycle, to a DAC Phase value of 4 in cycle 7. The loop is then released, and allowed to recover its nominal value, taking in this example y=2 clocks to do so.

As mentioned above, the offset variance period measured as x clocks should be equal to or just larger than the expected offset recovery time (y clocks), so as to in effect exercise the control loop in an efficient manner. Also, note that in this example, for the two clock cycles that the phase offset is being forced, the control loop is in effect running open-loop, and is therefore able to retrack only after the forcing function has been removed. Other ways of disturbing the control loop, including more complicated retard and advance offset patterns, may be used, including for example a combination of deterministic and random offsets.

The above-described methodologies for testing a receiver of an IC device may be preceded by placing the IC device into a test mode of operation (e.g., the REST Mode described above). The jitter injection may be performed as part of the IC device's built-in self-test procedure. The phase step magnitude and frequency parameters may be programmed into one or more registers of the IC device. A result of the evaluation of the recovered data may also be stored in one or more registers of the IC device that are accessible externally.

To summarize, various embodiments of a method and apparatus for testing an IC receiver have been described. In the foregoing specification, the invention has been described with reference to specific exemplary embodiments thereof. It will, however, be evident that various modifications and changes may be made thereto without departing from the broader spirit and scope of the invention as set forth in the appended claims. For instance, the phase interpolator loop described above is just one example of a closed control loop in a receiver that can be disturbed for testing. Other types of control loops that could be modified to support the disturbance capability include a spread spectrum tracking loop that tries to track a shifting frequency. In that case, the control loop maintains a running frequency variable that may be subjected to forced changes, as was the phase variable described above. The specification and drawings are, accordingly, to be regarded in an illustrative rather than a restrictive sense.

What is claimed is:

1. A method for testing a data recovery circuit, comprising: disturbing internally a running variable in a closed control loop of a data recovery circuit (DRC) while the DRC is processing a received test signal;

evaluating data, wherein the data was recovered by the DRC when the DRC was affected by the disturbing; and measuring the length of time it takes the DRC to recover from the disturbance.

2. The method of claim 1 wherein the disturbing comprises forcing a predetermined change to the value of a variable that represents a running phase of a phase interpolator loop of the DRC.

3. The method of claim 2 wherein the forcing the change comprises forcing a sampling phase register of the DRC to one of a) advance by a single count, and b) retard by a single count.

4. The method of claim 1 wherein the disturbing comprises:
forcing a sampling phase register of the DRC to advance, and then waiting for the DRC to compensate for the advance; and then
forcing the register to retard.

5. The method of claim 1 wherein the evaluating comprises:
comparing a test data sequence with a sequence of said data recovered by the DRC.

6. The method of claim 1 wherein the disturbing and evaluating are performed as part of an integrated circuit design validation process.

7. The method of claim 1 wherein the disturbing and evaluating are performed as part of a high volume manufacturing screening process.

8. A method for testing a receiver, comprising:
disturbing internally a recovered clock phase of a receiver to simulate an effect of jitter in an input signal being processed by the receiver; and
determining a reaction of the receiver to the disturbance, by monitoring a sampling phase register of the receiver as the receiver is processing the received test signal.

9. The method of claim 8 wherein the determining comprises comparing a data stream, recovered by the receiver while under the influence of said disturbance, with a transmitted data stream.

10. The method of claim 8 wherein the disturbing comprises deterministically forcing a multi-bit binary variable that represents the recovered clock phase in a closed control loop of the receiver to change its value so as to simulate the effect of jitter in the input signal.

11. A method for testing a receiver, comprising:
injecting jitter internally into a running phase of a closed control loop in a data link receiver of an integrated circuit device;
evaluating a data stream for an error, the data stream having been recovered by the receiver when the loop was affected by said injected jitter; and
determining a loop response of the closed control loop to said injected jitter.

12. The method of claim 11 further comprising:
placing the integrated circuit device in a test mode of operation, prior to injecting jitter and evaluating the data stream, wherein the jitter injection is performed as part of the integrated circuit device's built in self test procedure.

13. The method of claim 11 wherein the injected jitter is specified using a phase step magnitude and a frequency, the method further comprising:
programming one or more registers of the integrated circuit device with said magnitude and frequency; and
accessing one or more registers of the integrated circuit for a result of said evaluation.

14. The method of claim 13 further comprising:
looping back a clocked data stream, that was transmitted by the integrated circuit device, to said receiver to be recovered by the receiver while the loop is affected by said jitter.

15. The method of claim 11 wherein the loop response is determined by time stamping when the closed control loop has returned to within one phase step of the running phase at the time the jitter was injected.

16. An integrated circuit device comprising:
a chip I/O interface to a serial point to point data link, the interface having a receiver which includes an oversampling unit with an input for a received signal and an output for sampled data values, an advance or retard generator with an input for said sampled data values, a digital to analog converter (DAC) control unit with an input coupled to an output of the advance or retard generator, and an offset control unit with an input for a programmed test parameter and an output to force one of an advance and retard via the advance or retard generator.

17. The device of claim 16 further comprising:
a digital to analog converter (DAC) with an input coupled to an output of the DAC control unit; and
a mixer unit with an input coupled to an output of the DAC and an output to provide a sample dock to the oversampling unit.

18. The device of claim 16 further comprising:
a digital filter coupled between the advance or retard generator and the DAC control unit, an output of the filter coupled to the input of the DAC control unit.

* * * * *

UNITED STATES PATENT AND TRADEMARK OFFICE
CERTIFICATE OF CORRECTION

PATENT NO. : 7,243,272 B2 Page 1 of 1
APPLICATION NO. : 10/813144
DATED : July 10, 2007
INVENTOR(S) : Tarango et al.

It is certified that error appears in the above-identified patent and that said Letters Patent is hereby corrected as shown below:

In column 8, at line 42, delete "dock" and insert --clock--.

Signed and Sealed this

Twenty Second Day of April, 2008

JON W. DUDAS
*Director of the United States Patent and Trademark Office*